(12) United States Patent
Onozawa

(10) Patent No.: US 9,870,965 B2
(45) Date of Patent: Jan. 16, 2018

(54) SEMICONDUCTOR DEVICE

(71) Applicant: FUJI ELECTRIC CO., LTD., Kanagawa (JP)

(72) Inventor: Yuichi Onozawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/247,934

(22) Filed: Aug. 26, 2016

(65) Prior Publication Data

US 2017/0077004 A1 Mar. 16, 2017

(30) Foreign Application Priority Data

Sep. 16, 2015 (JP) .................................. 2015-183087

(51) Int. Cl.
| | |
|---|---|
| *H01L 21/66* | (2006.01) |
| *H01L 29/739* | (2006.01) |
| *H01L 29/06* | (2006.01) |
| *H01L 29/10* | (2006.01) |
| *H01L 29/66* | (2006.01) |
| *H01L 21/78* | (2006.01) |

(52) U.S. Cl.
CPC .............. *H01L 22/32* (2013.01); *H01L 21/78* (2013.01); *H01L 22/14* (2013.01); *H01L 29/0638* (2013.01); *H01L 29/1095* (2013.01); *H01L 29/66348* (2013.01); *H01L 29/7397* (2013.01); *H01L 2224/0603* (2013.01); *H01L 2224/4813* (2013.01); *H01L 2224/4846* (2013.01); *H01L 2224/49111* (2013.01); *H01L 2224/49175* (2013.01)

(58) Field of Classification Search
None
See application file for complete search history.

(56) References Cited

U.S. PATENT DOCUMENTS

| | | | |
|---|---|---|---|
| 2005/0017339 A1* | 1/2005 | Yoshiba | ............ H01L 23/49575 |
| | | | 257/686 |
| 2010/0090248 A1* | 4/2010 | Kouno | ................... H01L 29/861 |
| | | | 257/140 |
| 2013/0249008 A1* | 9/2013 | Sugimura | ............. H01L 23/495 |
| | | | 257/368 |
| 2015/0311285 A1 | 10/2015 | Momota et al. | |
| 2016/0020310 A1* | 1/2016 | Shiga | ...................... H01L 22/14 |
| | | | 257/139 |

FOREIGN PATENT DOCUMENTS

| | | |
|---|---|---|
| JP | 2010/050211 A | 3/2010 |
| JP | 2014/053552 A | 3/2014 |

* cited by examiner

*Primary Examiner* — Cuong B Nguyen

(57) ABSTRACT

Provided is a semiconductor device including a semiconductor substrate; a dummy trench that is formed on a front surface side of the semiconductor substrate; an emitter electrode that is formed above a front surface of the semiconductor substrate and includes a recessed portion that is a recess in an outer periphery thereof, as seen in a planar view; a dummy pad that is electrically connected to the dummy trench and has at least a portion thereof formed within the recessed portion, as seen in the planar view; and a dummy wire that electrically connects the emitter electrode and the dummy pad.

10 Claims, 14 Drawing Sheets

REGION A

SEMICONDUCTOR DEVICE

The contents of the following Japanese patent application are incorporated herein by reference:
2015-183087 filed in JP on Sep. 16, 2015

BACKGROUND

1. Technical Field

The present invention relates to a semiconductor device.

2. Related Art

Conventional art is known that includes screening a device by applying a suitable electric field to a semiconductor device having a trench structure after the device has been completed, as shown in Patent Documents 1 and 2, for example.
Patent Document 1: Japanese Patent Application Publication No. 2014-053552
Patent Document 2: Japanese Patent Application Publication No. 2010-050211

However, if a semiconductor device has a dummy trench structure with a fixed potential, it is impossible to apply a suitable electric field for screening to a region where the dummy trench structure is formed.

SUMMARY

According to a first aspect of the present invention, provided is a semiconductor device comprising a semiconductor substrate; a dummy trench that is formed on a front surface side of the semiconductor substrate; an emitter electrode that is formed above a front surface of the semiconductor substrate and includes a recessed portion that is a recess in an outer periphery thereof as seen in a planar view; a dummy pad that is electrically connected to the dummy trench and has at least a portion thereof formed within the recessed portion, as seen in the planar view; and a dummy wire that electrically connects the emitter electrode and the dummy pad.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
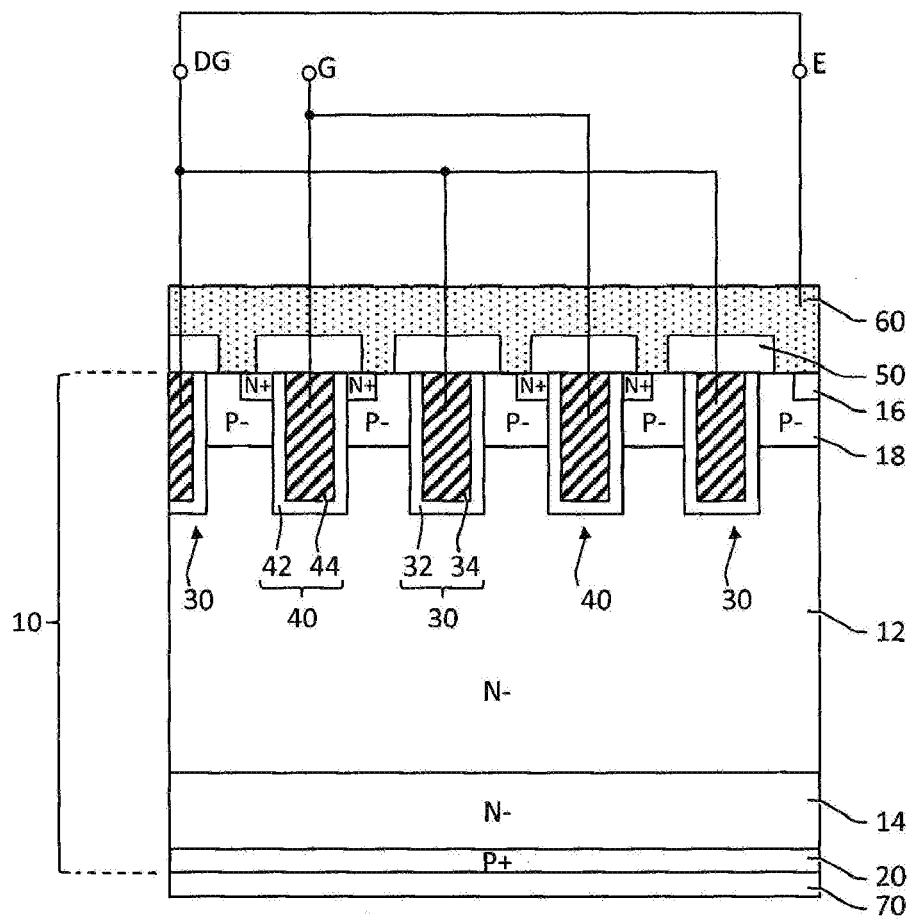
FIG. 1 is a cross-sectional view of an exemplary completed semiconductor device 100.

FIG. 1 is a cross-sectional view of an exemplary completed semiconductor device 100. The semiconductor device 100 of this example is an IGBT (Insulated Gate Bipolar Transistor) formed on a semiconductor substrate 10. In this example, the cross-sectional structure and electrical connection relationships of the semiconductor device 100 after assembly are shown.

The semiconductor device 100 includes a gate trench 40, a dummy trench 30, an interlayer insulating film 50, and an emitter electrode 60 on a front surface side of the chip. The semiconductor device 100 includes a collector electrode 70 on a back surface side of the chip. In this Specification, the surfaces of the substrate, layers, regions, and the like that are on the emitter electrode 60 side are referred to as the front surfaces, and the surfaces on the collector electrode 70 side are referred to as the back surfaces. Furthermore, the direction connecting the emitter electrode 60 and the collector electrode 70 is referred to as the depth direction.

A drift region 12, a buffer region 14, an emitter region 16, a base region 18, and a collector region 20 are formed in the semiconductor substrate 10. The semiconductor substrate 10 has a first conduction type. The semiconductor substrate 10 of this example is N− type. The semiconductor substrate 10 may be a silicon substrate, and may be a silicon carbide substrate, a nitride semiconductor substrate, or the like.

The drift region 12 has the same conduction type as the semiconductor substrate 10. The drift region 12 has the first conduction type. The drift region 12 of this example is N− type.

The buffer region 14 is formed on the back surface side of the drift region 12. The impurity concentration of the buffer region 14 is higher than the impurity concentration of the drift region 12. The buffer region 14 may function as a field stop layer that prevents the depletion layer that expands from the back surface side of the base region 18 from reaching the collector region 20.

The base region 18 is formed in a prescribed range from the end of the semiconductor substrate 10 on the side where the emitter electrode 60 is formed. The base region 18 has a second conduction type, which is different from the conduction type of the semiconductor substrate 10. The base region 18 is P− type. The first and second conduction types may be opposite conduction types.

The emitter region 16 is formed within the base region 18, adjacent to the gate trench 40. The emitter region 16 has the first conduction type and a higher impurity concentration than the drift region 12. The emitter region 16 of this example is N+ type.

The gate trench 40 is formed extending in the depth direction of the semiconductor substrate 10 in the front surface of the semiconductor substrate 10. The gate trench 40 includes a gate insulating film 42 and a gate conduction portion 44. A channel region (inversion layer) is formed in the side walls of the gate trench 40. The semiconductor device 100 includes one or more gate trenches 40 arranged at prescribed intervals along an arrangement direction that is perpendicular to the extension direction.

The dummy trench 30 is formed extending in an extension direction that is the same as the extension direction of the gate trench 40, in the front surface of the semiconductor substrate 10. The dummy trench 30 includes a dummy insulating film 32 and a dummy conduction portion 34. The semiconductor device 100 includes one or more dummy trenches 30 that are arranged at prescribed intervals in the arrangement direction that is perpendicular to the extension direction. In this example, a plurality of dummy trenches 30 and a plurality of gate trenches 40 are arranged in parallel and in an alternating manner.

The interlayer insulating film 50 is provided between the semiconductor substrate 10 and the electrodes formed on the front surface side of the semiconductor substrate 10. The interlayer insulating film 50 has openings formed with a prescribed pattern. Contact portions that connect the electrodes on the interlayer insulating film 50 and prescribed regions formed on the front surface of the semiconductor substrate 10 are formed in the openings of the interlayer insulating film 50. As an example, the interlayer insulating film 50 is an insulating film such as a PSG film or BPSG film.

The emitter electrode 60 is formed above the interlayer insulating film 50 on the front surface side of the semiconductor substrate 10. The emitter electrode 60 is electrically connected to the emitter region 16 according to the pattern opened in the interlayer insulating film 50. The emitter electrode 60 is formed of a conductive material such as metal. For example, at least a partial region of the emitter electrode 60 is formed of aluminum. Each electrode has a region formed of a material including tungsten.

Figure 2:
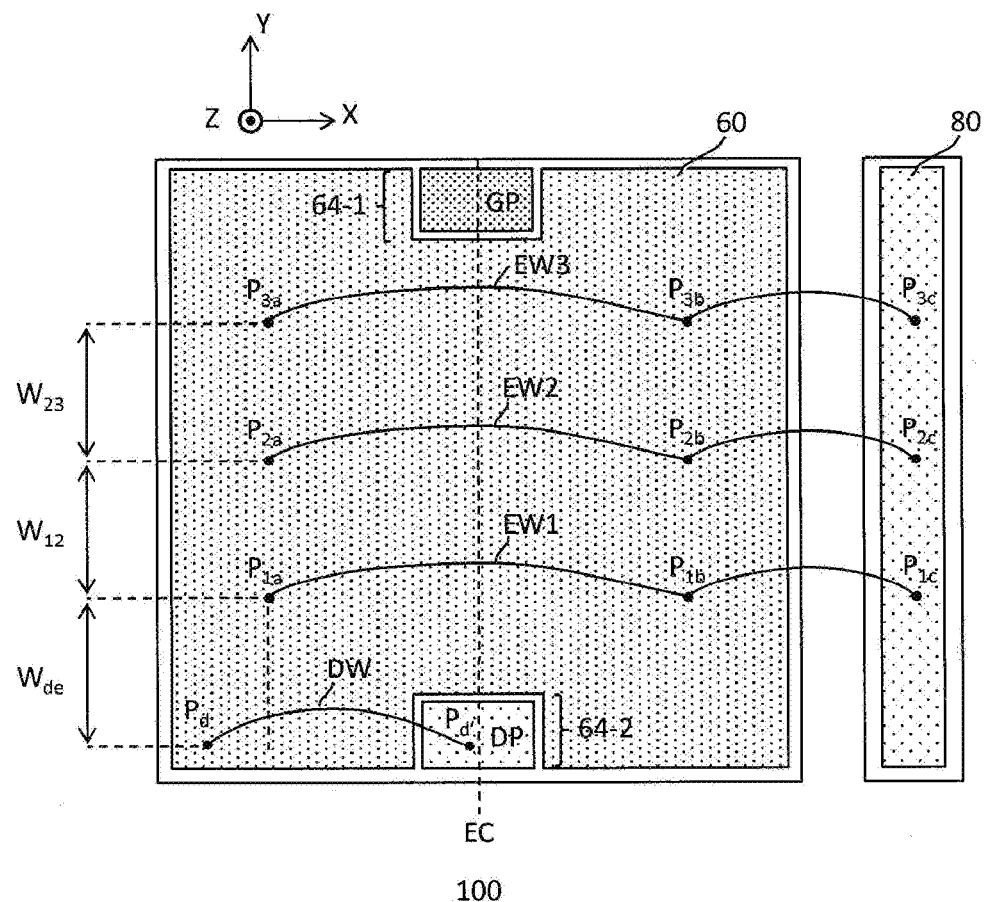
FIG. 2 is an exemplary planar view of the semiconductor device 100.

FIG. 2 is an exemplary planar view of the semiconductor device 100. In this example, the semiconductor device 100 is shown after the step of wire bonding. A gate pad GP, a dummy pad DP, and an emitter electrode 60 are formed on the top surface of the semiconductor device 100.

The emitter electrode 60 includes recessed portions 64 that are recesses in the outer periphery thereof, as seen in a planar view. The emitter electrode 60 of this example includes two recessed portions, which are a first recessed portion 64-1 and a second recessed portion 64-2. In this Specification, a planar view refers to a view from a direction perpendicular to the front surface of the semiconductor substrate 10 on which the emitter electrode 60 is formed. The recessed portions 64 of this example are arranged with linear symmetry relative to a central line EC of the emitter electrode 60. The central line EC of this example is defined as a straight line passing through the center of the emitter electrode 60.

The gate pad GP is electrically connected to the gate conduction portion 44. The gate pad GP is formed within the first recessed portion 64-1 of the emitter electrode 60, as seen in a planar view. In this example, the first recessed portion 64-1 is formed with linear symmetry relative to the central line EC, and the gate pad GP is correspondingly formed with linear symmetry relative to the central line EC. The gate pad GP needs not be arranged entirely within the first recessed portion 64-1, as long as at least a portion of the gate pad GP is contained within the first recessed portion 64-1 of the emitter electrode 60. For example, in a case where the gate pad GP is square-shaped, arranging three sides of the gate pad GP facing the end portion of the emitter electrode 60 means that the gate pad GP is formed within the recessed portion 64. A gate runner GR connected to the gate pad GP may be formed on the periphery of the emitter electrode 60.

The dummy pad DP is electrically connected to the dummy conduction portion 34. The dummy pad DP is formed within the second recessed portion 64-2 of the emitter electrode 60, as seen in a planar view. In this example, the second recessed portion 64-2 is formed with linear symmetry relative to the central line EC, and the dummy pad DP is correspondingly formed with linear symmetry relative to the central line EC. The dummy pad DP needs not be arranged entirely within the second recessed portion 64-2, as long as at least a portion of the dummy pad DP is contained within the second recessed portion 64-2 of the emitter electrode 60. For example, in a case where the dummy pad DP is square-shaped, arranging three sides of the dummy pad DP facing the end portion of the emitter electrode 60 means that the dummy pad DP is formed within the recessed portion 64. A dummy runner DR connected to the dummy pad DP may be formed on the periphery of the emitter electrode 60.

The external terminal 80 is electrically connected to the emitter electrode 60 via one or more emitter wires EW. The external terminal 80 of this example is electrically connected to the emitter electrode 60 by three emitter wires EW1 to EW3 arranged in parallel. The external terminal 80 is arranged on the positive side in the X-axis direction relative to the central line EC, and therefore the lead side of the emitter wires EW is also on the positive side in the X-axis direction.

There are two connection points between each of the emitter wires EW1 to EW3 and the emitter electrode 60, and one connection point between each of the emitter wires EW1 to EW3 and the external terminal 80. The number of connection points between each of the emitter wires EW and each electrode is not limited to this example, and may be set as desired. In this Specification, a connection point refers to a central point in the plane of contact between a bonding wire and an electrode.

As an example, the emitter wire EW1 is electrically connected to the emitter electrode 60 at a connection point $P_{1a}$ and a connection point $P_{1b}$, and is electrically connected to the external terminal 80 at a connection point $P_{1c}$. The emitter wire EW2 is electrically connected to the emitter electrode 60 at a connection point $P_{2a}$ and a connection point $P_{2b}$, and is electrically connected to the external terminal 80 at a connection point $P_{2c}$. The emitter wire EW3 is electrically connected to the emitter electrode 60 at a connection point $P_{3a}$ and a connection point $P_{3b}$, and is electrically connected to the external terminal 80 at a connection point $P_{3c}$.

The connection points $P_{1a}$, $P_{2b}$, and $P_{3a}$ are arranged farthest on the negative side in the X-axis direction in their respective emitter wires EW1 to EW3. The connection points $P_{1a}$, $P_{2a}$, and $P_{3a}$ of this example are arranged farther in the negative X-axis direction than the central line EC. On the other hand, the connection points $P_{1b}$, $P_{2b}$, and $P_{3b}$ are arranged farther in the positive X-axis direction than the connection points $P_{1a}$, $P_{2a}$, and $P_{3a}$. The connection points $P_{1b}$, $P_{2b}$, and $P_{3b}$ of this example are arranged farther in the positive X-axis direction than the central line EC. In other words, each emitter wire EW1 to EW3 has at least one connection point on the lead side of the central line EC and at least one connection point on the side of the central line EC that is opposite the lead side.

The emitter wires EW1 to EW3 are arranged in parallel. In other words, a virtual straight line connecting the connection points $P_{1a}$, $P_{1b}$ and $P_{1c}$ is substantially parallel to a virtual straight line connecting the connection points $P_{2a}$, $P_{2b}$, and $P_{2c}$ and a virtual straight line connecting the connection points $P_{3a}$, $P_{3b}$, and $P_{3c}$. Here, the state of the emitter wires EW1 to EW3 being arranged substantially parallel to each other does not necessarily mean that the virtual straight lines are completely parallel to each other, and may include a case in which shifting of the connection points has occurred during the wire bonding or shifting has occurred that does not noticeably affect the characteristics of the semiconductor device 100.

The emitter wires EW1 to EW3 are arranged at uniform intervals. The interval between the emitter wire EW1 and the emitter wire EW2 is represented by the distance $W_{12}$ between the connection points $P_{1a}$ and $P_{2a}$. Furthermore, the interval between the emitter wire EW2 and the emitter wire EW3 is represented by the distance $W_{23}$ between the connection points $P_{2a}$ and $P_{3a}$ this example, the distance $W_{12}$ is equal to the distance $W_{23}$. However, it should be noted that the intervals between the emitter wires EW1 to EW3 may be different. The interval between the emitter wire EW1 and the emitter wire EW2 may be represented by the distance W between the connection points $P_{1b}$ and $P_{2b}$. Similarly, the interval between the emitter wire EW2 and the emitter wire EW3 may be represented by the distance W between the connection points $P_{2b}$ and $P_{3b}$.

The dummy pad DP is electrically connected to the emitter electrode 60 via the dummy wire DW. The dummy wire DW of this example is electrically connected to the emitter electrode 60 at the connection point $P_d$ and is electrically connected to the dummy pad DP at the connection point $P_{d'}$.

The connection point $P_d$ of the dummy wire is arranged on the side opposite the lead side, i.e. the negative side in the X-axis direction. The connection point $P_d$ of the dummy wire DW is preferably distanced from the dummy pad DP. For example, the interval between the connection point $P_d$ and the connection point $P_{d'}$ is preferably greater than the interval between the connection point $P_{d'}$ and the connection point $P_{1a}$ of the emitter wire EW1 adjacent to the dummy pad DP.

In a case where the lead sides of the emitter wires EW1 to EW3 are on the positive side in the X-axis direction, the connection points $P_{1a}$, $P_{2a}$, and $P_{3a}$, which are the connection points of the emitter wires EW1 to EW3 that are farthest on the negative side in the X-axis direction, are preferably arranged on the negative side in the X-axis direction. In other words, the connection point $P_d$ of the dummy wire DW is preferably closer than the connection points $P_{1a}$, $P_{2a}$, and $P_{3a}$ of the emitter wires EW1 to EW3 to the end of the emitter electrode 60 on the side opposite the lead side. In this way, the degree of freedom for routing the leads during bonding of the dummy wire DW is improved.

Furthermore, the dummy wire DW is preferably arranged at a prescribed distance from the emitter wires EW1 to EW3. For example, the interval between the dummy wire DW and the emitter wire EW1 is preferably greater than each of the intervals between the emitter wires EW1 to EW3. In other words, the distance $W_{de}$ between the connection point $P_d$ of the dummy wire DW and the connection point $P_{1a}$ of the emitter wire EW1 is preferably greater than each of the distances $W_{12}$ and $W_{23}$, which are the intervals between the emitter wires EW1 to EW3.

Here, because of current crowding at each connection point of the emitter wires EW, the potential of the connection points is raised to be higher than the potential of other regions. In this way, by distancing the connection point $P_d$ of the dummy wire DW as far as possible from the connection point $P_{1a}$ of the emitter wire EW1, the effect that the potential being raised has on the dummy wire DW is reduced.

Figure 3:
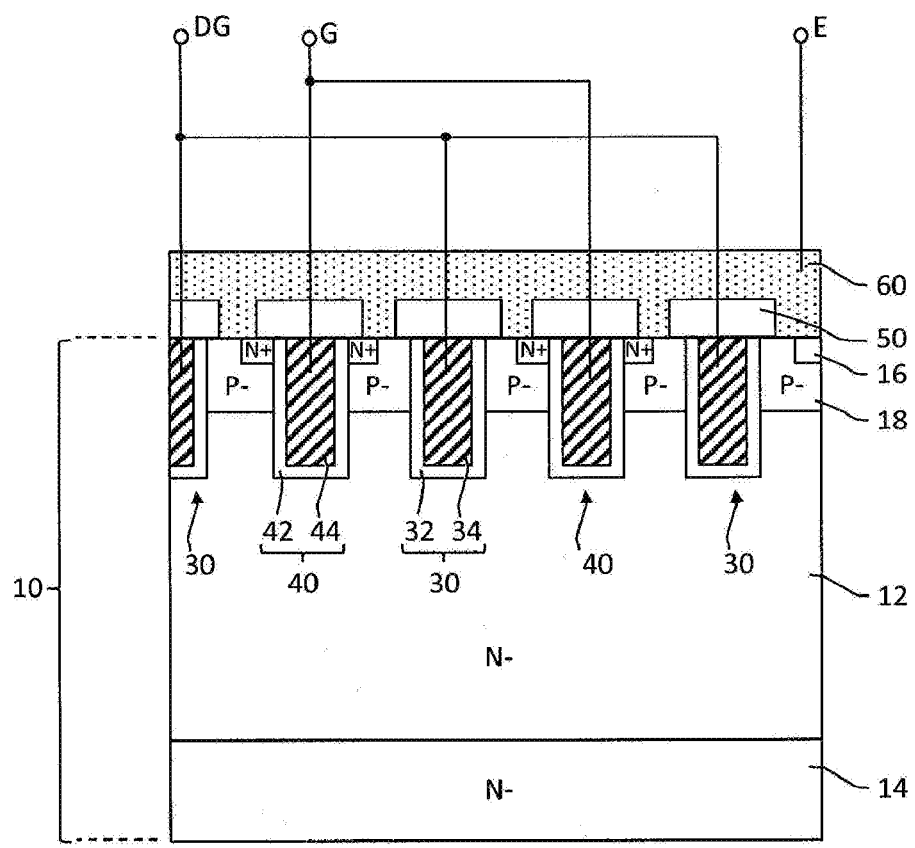
FIG. 3 is a cross-sectional view of the semiconductor device 100 during the step of screening in the manufacturing process.

FIG. 3 is a cross-sectional view of the semiconductor device 100 during the step of screening in the manufacturing process. The semiconductor device 100 of this example differs from the completed semiconductor device 100 shown in FIG. 1 in that the dummy conduction portions 34 and the emitter electrode 60 are not electrically connected.

In the screening step, the reliability of the dummy insulating film 32 and the gate insulating film 42 is evaluated. Specifically, the reliability of the dummy insulating film 32 and the gate insulating film 42 is evaluated by applying a prescribed voltage between the dummy conduction portions 34 and the semiconductor layer sandwiching the dummy insulating film 32 and between the gate conduction portion 44 and the semiconductor layer sandwiching the gate insulating film 42. For example, the prescribed voltage applied between the dummy conduction portion 34 and the emitter electrode 60 during screening has a voltage value that is greater than the rated voltage, i.e. the upper limit value set according to the product specifications, and lower than the insulated breakdown voltage of the dummy insulating film 32.

The semiconductor device 100 of this example has the emitter electrode 60 formed on the front surface side, but the bonding step and other steps performed on the back surface side, such as forming the collector electrode 70 are not performed. In other words, in the screening step, since the bonding step has not been performed, the dummy conduction portion 34 and the emitter electrode 60 are in an electrically disconnected state. Similarly, the gate conduction portions 44 and the emitter electrode 60 are in an electrically disconnected state. As a result, it is possible to screen both the dummy insulating film 32 and the gate conduction portions 44.

In a conventional semiconductor device having a dummy trench, the potential of the dummy conduction portions is fixed at the same potential as the emitter and the source by electrically connecting the dummy conduction portions to the emitter and source, and therefore it is difficult to apply a suitable electric field to the dummy insulating film. Therefore, the dummy insulating film cannot be suitably screened.

Figure 4:
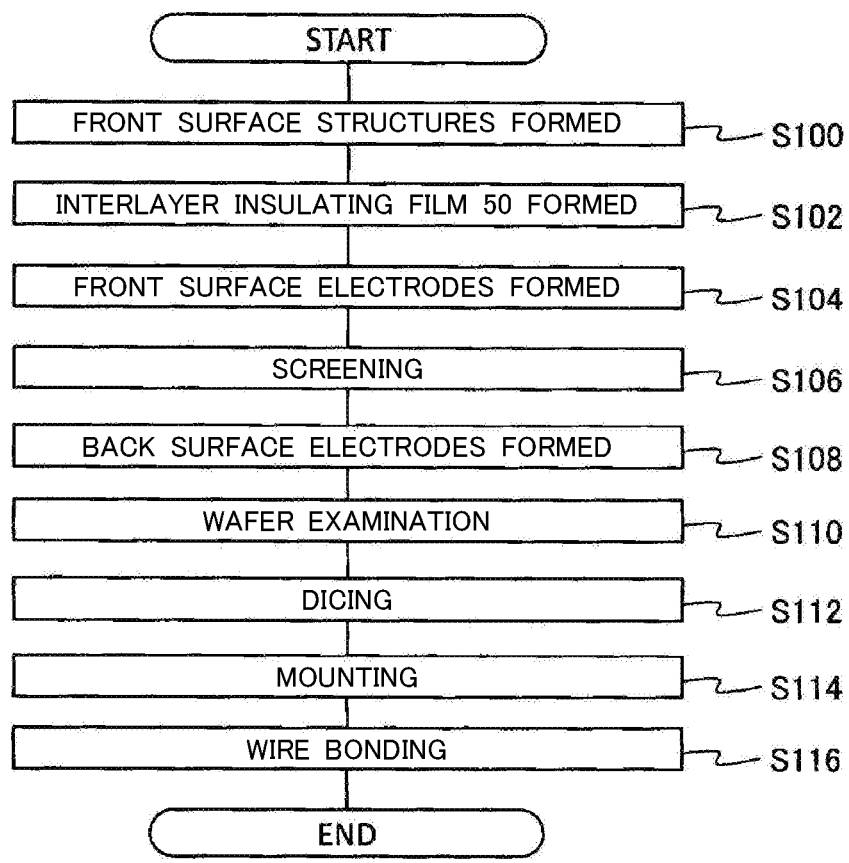
FIG. 4 shows an exemplary manufacturing process of the semiconductor device 100.

FIG. 4 shows an exemplary manufacturing process of the semiconductor device 100. In this example, by performing steps S100 to S116, the dummy trenches 30 are suitably screened and the semiconductor device 100 is manufactured.

First, structures on the front surface side, such as the drift region 12, the emitter region 16, the base region 18, the dummy trenches 30, and the gate trenches 40, are formed on the semiconductor substrate 10 (S100). The structures on the front surface side may be formed by general methods that are used in semiconductor manufacturing.

Next, the interlayer insulating film 50 having a prescribed pattern is formed on the front surface side of the semiconductor substrate 10 (S102). The formation of the pattern of the interlayer insulating film 50 may be achieved through an etching or lift-off technique. After this, the electrodes on the front surface side are formed on the front surface side of the semiconductor substrate 10 (S104). The electrodes on the front surface side refer to the dummy pad DP, the gate pad GP, and the emitter electrode 60.

Next, the dummy insulating film 32 and the gate insulating film 42 are screened (S106). By performing the screening after forming the electrodes on the front surface side, it is possible to perform accurate screening. Furthermore, by marking semiconductor chips that have been judged as failing in the screening step, these semiconductor chips may be omitted from later steps. After this, the electrode on the back surface side is formed (S108). For example, the electrode on the back surface is the collector electrode 70.

After forming the structure of the semiconductor device 100, a general wafer examination is performed without performing screening (S110). For example, the wafer examination is a WAT (Wafer Acceptance Test) that includes evaluating whether the semiconductor device 100 is operating correctly by running current through the semiconductor device 100. In the wafer examination, the threshold voltage, the presence of a leak current, the ON voltage, and the like are evaluated. In the wafer examination step as well, by marking semiconductor chips that have been judged to be failing in the screening step, these semiconductor chips may be omitted from later steps.

Next, the semiconductor wafer is diced into individual chips (S112). At this time, semiconductor chips that have been judged to be failing during the screening step of S106 or the wafer examination step of S110 are removed. For example, the chips that have been judged to be failing are removed by gathering only the semiconductor chips that were judged to be passing after the semiconductor wafer is diced. In this way, the later assembly step can be simplified.

Next, general assembly is performed to implement the semiconductor chips in packages. For example, the back surface of a semiconductor ship is soldered (mounted) onto an insulating substrate such as a DCB (Direct Copper Bonding) substrate (S114). After this, the dummy pad DP, the gate pad GP, and the emitter electrode 60 are wire bonded. In this way, the semiconductor device 100, which is an IGBT with a trench gate as shown in FIG. 2, is completed.

First Embodiment Example

Figure 5:
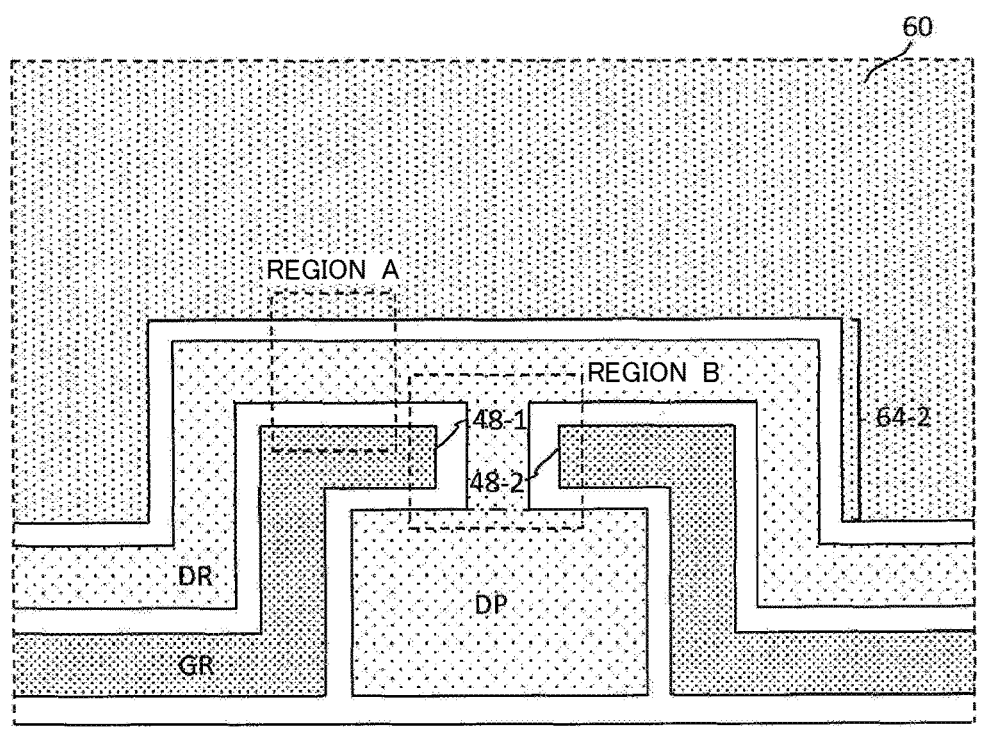
FIG. 5 is a planar view in which the region around the dummy pad DP according to a first embodiment example is enlarged.

FIG. 5 is a planar view in which the region around the dummy pad DP according to a first embodiment example is enlarged. In this example, a dummy runner DR and gate runner GR formed around the dummy pad DP are shown.

The dummy runner DR is arranged on the outer periphery of the emitter electrode 60. The dummy runner DR of this example is arranged along the second recessed portion 64-2 of the emitter electrode 60. The dummy runner DR is electrically connected to the dummy pad DP inside the second recessed portion 64-2 of the emitter electrode 60. In this way, at least a portion of the dummy runner DR of this example is formed inside the second recessed portion 64-2 of the emitter electrode 60.

The gate runner GR is formed along the outer periphery of the dummy runner DR and the emitter electrode 60. The gate runner GR of this example includes a first opposing end portion 48-1 and a second opposing end portion 48-2. The dummy runner DR is arranged between the first opposing end portion 48-1 and the second opposing end portion 48-2. In other words, the dummy runner DR transects the space between the first opposing end portion 48-1 and the second opposing end portion 48-2. In this way, the dummy runner DR formed along the inner periphery of the gate runner GR can be electrically connected to the dummy pad DP arranged outside the gate runner GR. The gate runner GR of this example is formed of a conductive material such as polysilicon.

Figure 6:
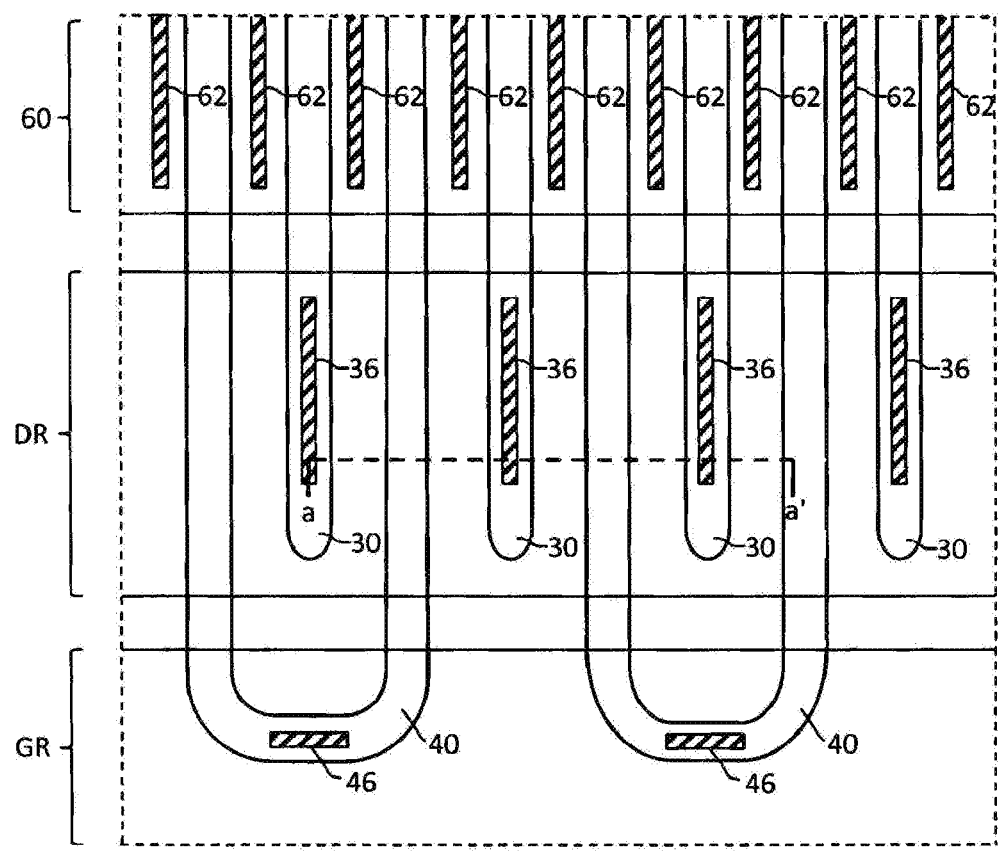
FIG. 6 is a cross-sectional view of the flat surface of region A shown in FIG. 5.

FIG. 6 is a cross-sectional view of the flat surface of region A shown in FIG. 5. Region A shows an end of the emitter electrode 60 on the dummy pad DP side and portions of the dummy runner DR and the gate runner GR.

The dummy trenches 30 extend from the emitter electrode 60 to the dummy runner DR, as seen in the planar view. At least some of the dummy conduction portions 34 of the dummy trenches 30 are electrically connected to the dummy runner DR, via the dummy contacts 36.

The dummy contacts 36 are arranged to correspond to the plurality of dummy trenches 30, as seen in the planar view. The positions where the dummy contacts 36 of this example are provided are merely examples, and the number and shapes of the dummy contacts 36 may be selected as desired. The dummy contacts 36 are formed of a conductive material such as metal, for example.

The gate trenches 40 extend from the emitter electrode 60 to the gate runner GR, beyond the dummy runner DR, as seen in the planar view. At least some of the gate conduction portions 44 of the gate trenches 40 are electrically connected to the gate runner GR via the gate contacts 46.

The gate contacts 46 are arranged to correspond to the plurality of gate trenches 40, as seen in the planar view. The positions where the gate contacts 46 of this example are provided are merely examples, and the number and shapes of the gate contacts 46 may be selected as desired. The gate contacts 46 are formed of a conductive material such as metal, for example.

The emitter contacts 62 are arranged to correspond to the emitter regions 16 at the ends of the gate trenches 40, as seen in the planar view. The positions where the emitter contacts 62 of this example are provided are merely examples, and the number and shapes of the emitter contacts 62 may be selected as desired. The emitter contacts 62 are formed of a conductive material such as metal, for example.

Figure 7:
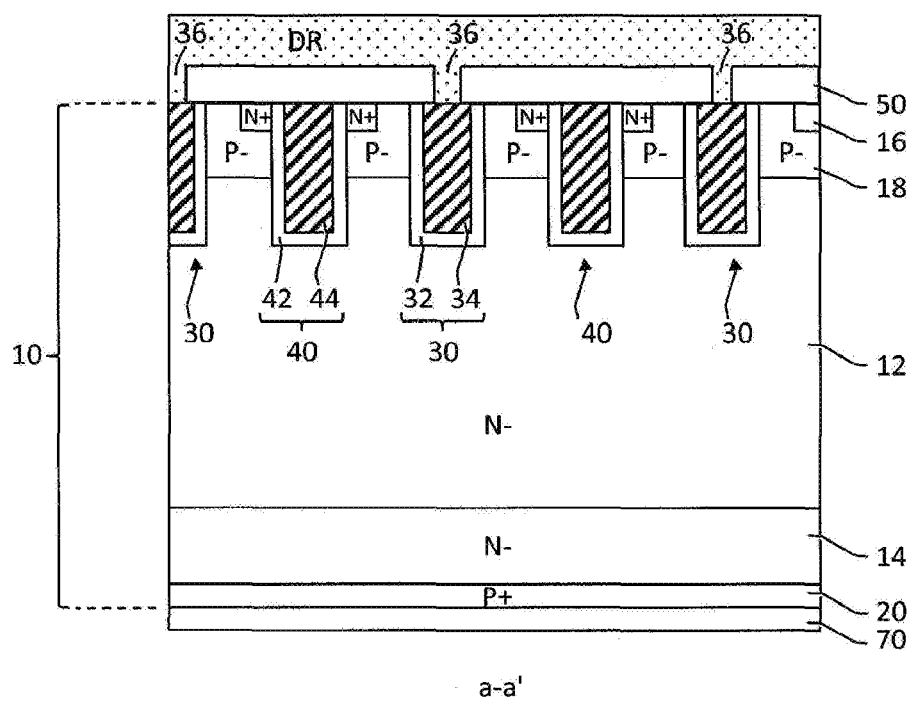
FIG. 7 shows an exemplary cross section taken along the line a-a' shown in FIG. 6.

FIG. 7 shows an exemplary cross section taken along the line a-a' shown in FIG. 6. The a-a' cross section is a cross section of a region provided with the dummy runner DR and is perpendicular to the dummy trenches 30 and the gate trenches 40.

In the region where the dummy runner DR is provided, the dummy contacts 36 are electrically connected to the dummy conduction portions 34 and the dummy runner DR. On the other hand, the gate conduction portions 44 are covered by the interlayer insulating film 50, and are not electrically connected to the dummy runner DR.

Figure 8:
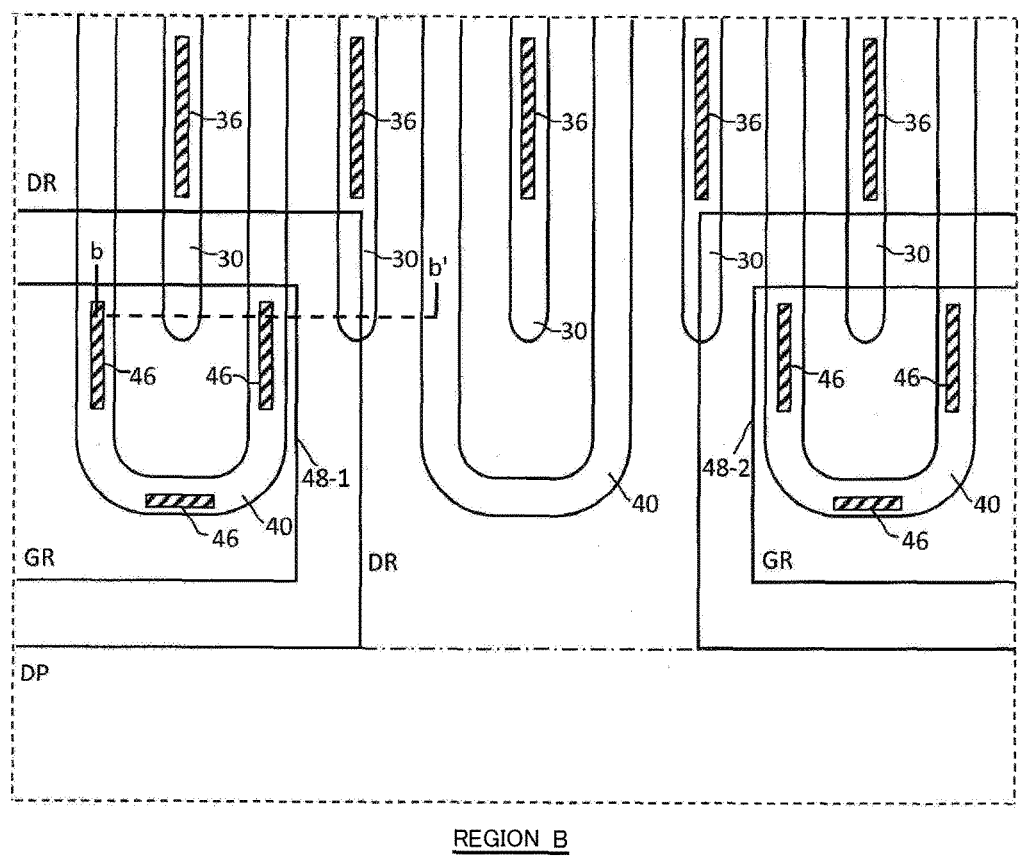
FIG. 8 is a cross-sectional view of the flat surface of region B shown in FIG. 5.

FIG. 8 is a cross-sectional view of the flat surface of region B shown in FIG. 5. Region B is an enlarged view of the region near the dummy runner DR sandwiched by the first opposing end portion 48-1 and the second opposing end portion 48-2.

In this example, in the region where the gate runner GR is provided, the gate conduction portions 44 are electrically connected to the gate runner GR by the gate contacts 46. On the other hand, in the region where the dummy runner DR is provided, no gate contacts 46 are provided. However, it should be noted that in the region where the dummy runner DR is provided, the dummy runner DR and the dummy conduction portions 34 are electrically connected by the dummy contacts 36. The shapes, numbers, and positions of the dummy contacts 36 and gate contacts 46 of this example are merely examples, and the present invention is not limited to this.

Figure 9:
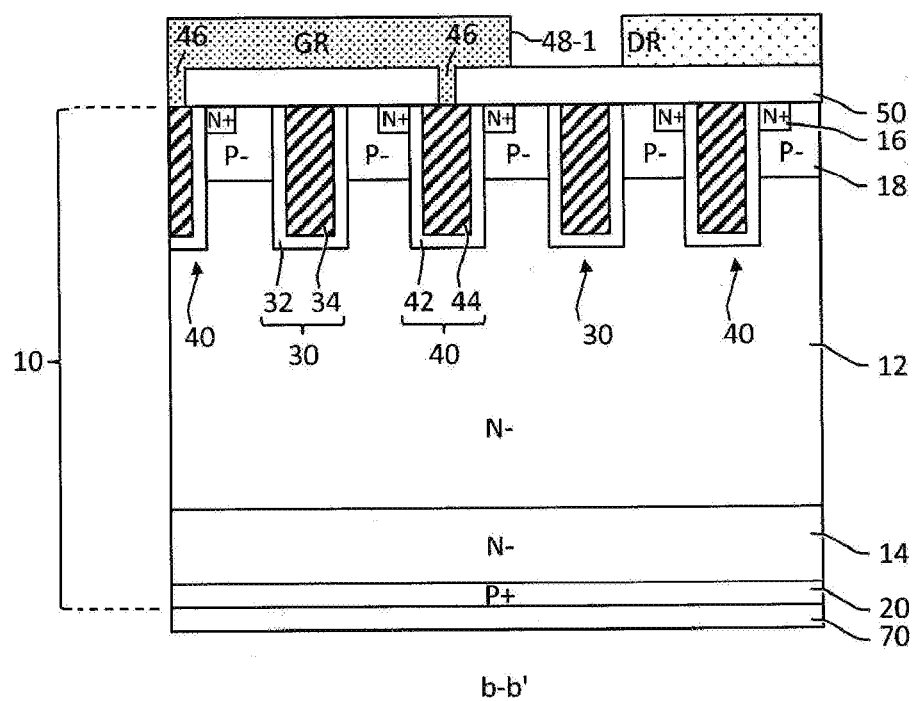
FIG. 9 shows an exemplary cross section taken along the line b-b' shown in FIG. 8.

FIG. 9 shows an exemplary cross section taken along the line b-b' shown in FIG. 8. The b-b' cross section is across section of a region provided with the gate runner GR and the dummy runner DR near the first opposing end portion 48-1, and is perpendicular to the dummy trenches 30 and the gate trenches 40.

In the region where the gate runner GR is provided, the gate runner GR and the gate conduction portions 44 are electrically connected by the gate contacts 46. On the other hand, in the region where the gate runner GR is provided, the dummy conduction portions 34 are covered by the interlayer insulating film 50 and are not electrically connected to the gate runner GR. Furthermore, in the region where the dummy runner DR is provided, the gate trenches 40 are covered by the interlayer insulating film 50 and are not electrically connected to the dummy runner DR.

Second Embodiment Example

Figure 10:
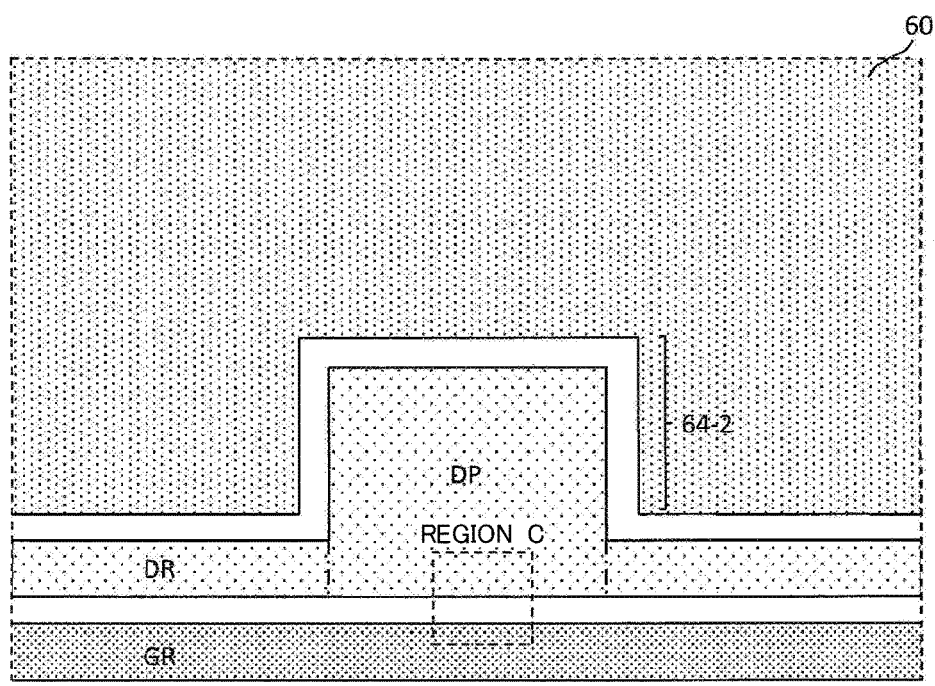
FIG. 10 is an exemplary planar view in which the region around the dummy pad DP according to a second embodiment example is enlarged.

FIG. 10 is an exemplary planar view in which the region around the dummy pad DP according to a second embodiment example is enlarged. The gate runner GR of this example does not include the opposing end portions 48.

At least a portion of the dummy pad DP is formed within the second recessed portion 64-2, in the same manner as in the first embodiment example. The dummy runner DR is connected to the dummy pad DP, and is formed as a ring that surrounds the outside of the emitter electrode 60.

The gate runner GR is formed as a ring that surrounds the outer periphery of the emitter electrode 60 and the dummy runner DR. The gate runner GR of this example does not include the opposing end portions 48, such as are included in the gate runner GR according to the first embodiment example, and therefore the potential of the gate conduction portion 44 can be controlled to be more uniform.

Figure 11:
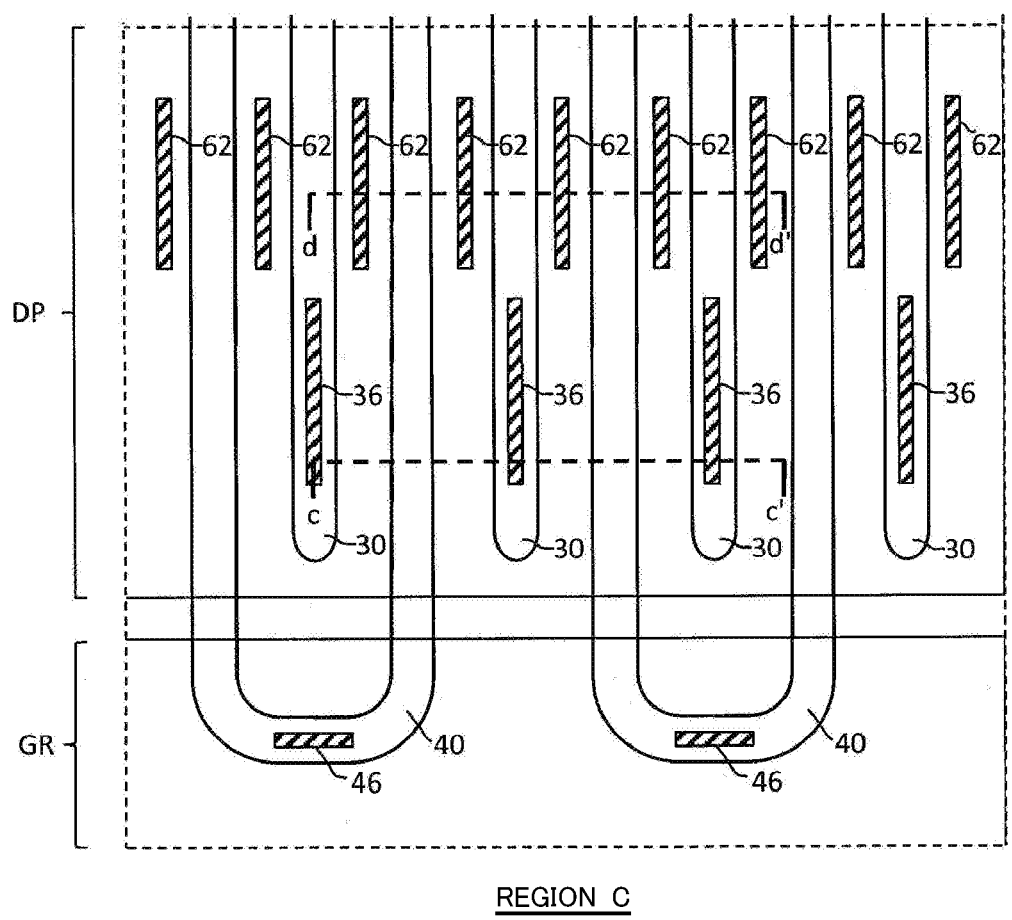
FIG. 11 is a cross-sectional view of the flat surface of region C shown in FIG. 10.

FIG. 11 is a cross-sectional view of the flat surface of region C shown in FIG. 10. Region C corresponds to a portion of the region of the dummy pad DP and the gate runner GR.

At least a portion of the dummy trenches 30 and the gate trenches 40 is formed in bottom layer of the dummy pad DP. Furthermore, at least a portion of the gate trenches 40 is formed in the bottom layer of the gate runner GR.

In this example, in the region where the dummy pad is provided, the dummy pad DP and the dummy conduction portions 34 are electrically connected by arranging the dummy contacts 36. In the region where the dummy pad DP is provided, no gate contacts 46 are provided. Furthermore, in the region where the dummy pad DP is provided, the dummy pad DP and the emitter region 16 are electrically connected by arranging the emitter contacts 62.

On the other hand, in the region where the gate runner GR is provided, the gate runner GR and the gate conduction portions 44 are electrically connected by arranging the gate contacts 46. In the region where the gate runner is provided, no dummy contacts 36 are provided.

Figure 12:
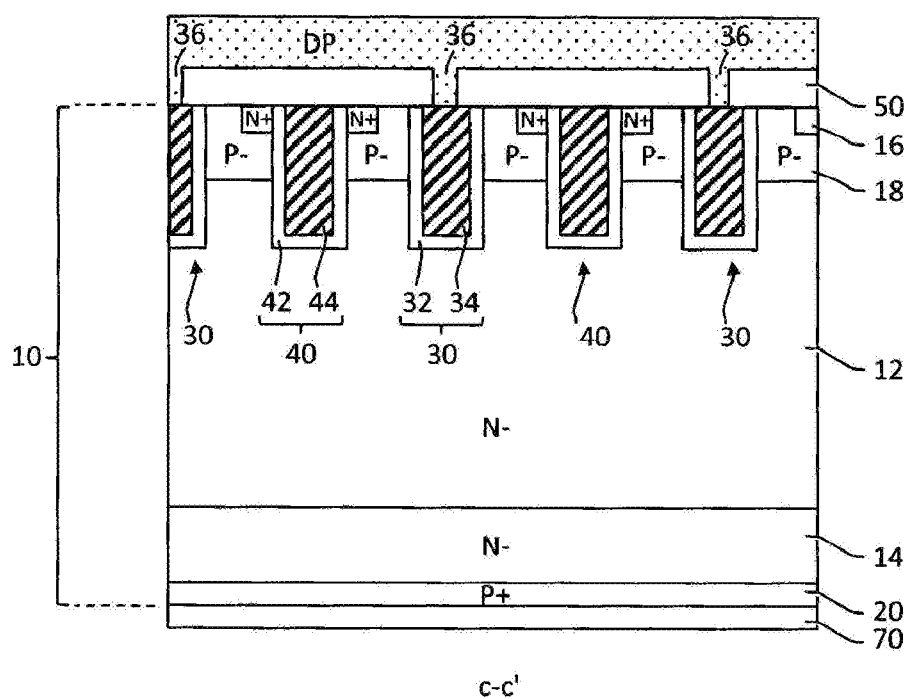
FIG. 12 shows an exemplary cross section taken along the line c-c' shown in FIG. 11.

FIG. 12 shows an exemplary cross section taken along the line c-c' shown in FIG. 11. The c-c' cross section is a cross section of a region provided with the dummy pad DP, and is perpendicular to the dummy trenches 30 and the gate trenches 40.

In the region where the dummy pad DP is provided, the dummy conduction portions 34 and the dummy pad DP are electrically connected by the dummy contacts 36. On the other hand, the gate conduction portions 44 are covered by the interlayer insulating film 50 and are not electrically connected to the dummy pad DP.

Figure 13:
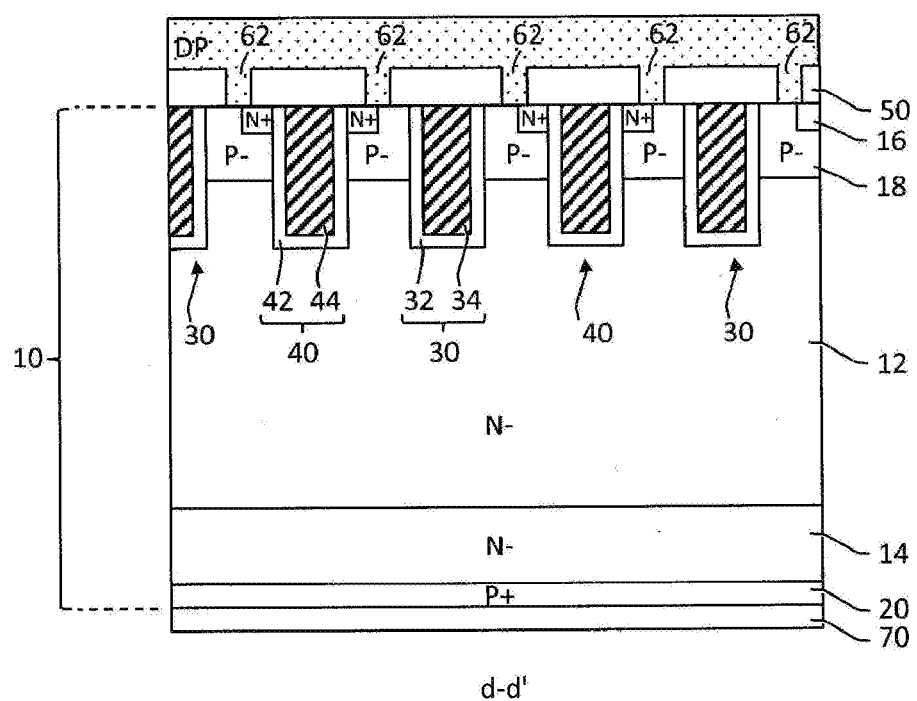
FIG. 13 shows an exemplary cross section taken along the line d-d' shown in FIG. 11.

FIG. 13 shows an exemplary cross section taken along the line d-d' shown in FIG. 11. The d-d' cross section is a cross section of a region provided with the dummy pad DP, and is perpendicular to the dummy trenches 30 and the gate trenches 40.

In the region where the dummy pad DP is provided, the emitter region 16 and the dummy pad DP are electrically connected by the emitter contacts 62. On the other hand, the dummy conduction portions 34 and the gate conduction portions 44 are covered by the interlayer insulating film 50, and are not electrically connected to the dummy pad DP.

Third Embodiment Example

Figure 14:
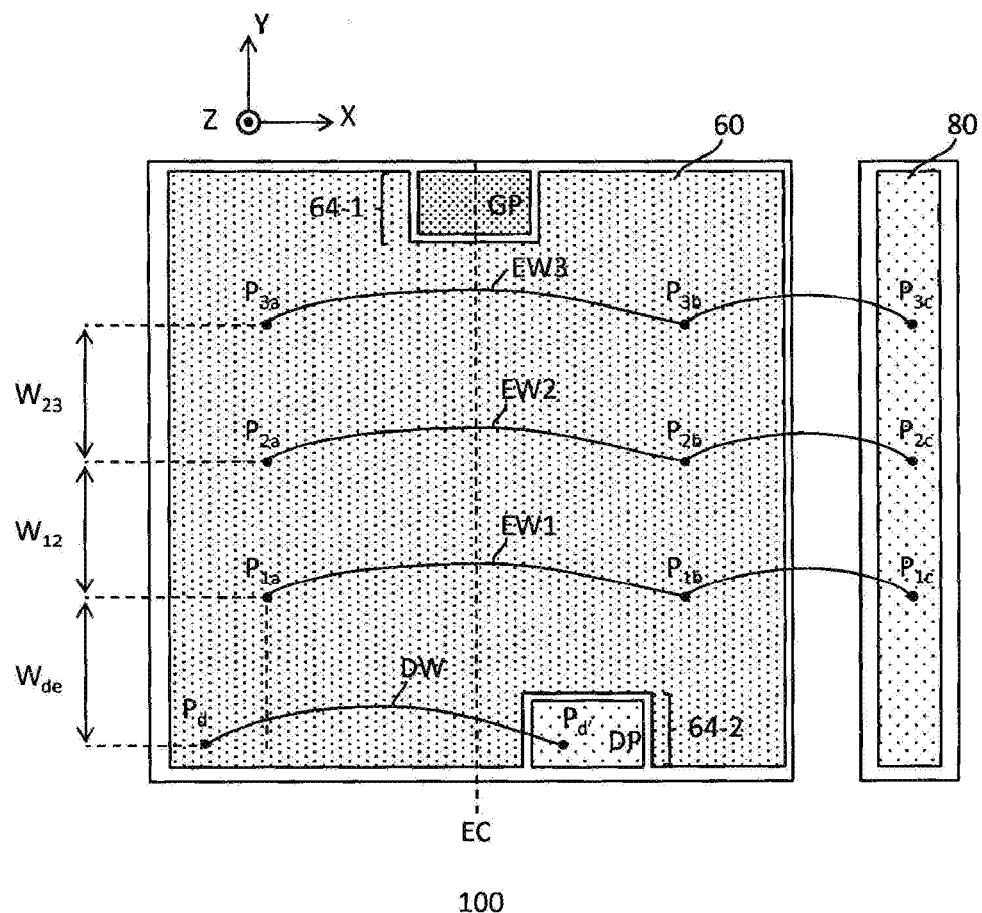
FIG. 14 is a planar view of the overall semiconductor device 100 according to a third embodiment example.

FIG. 14 is a planar view of the overall semiconductor device 100 according to a third embodiment example. The dummy pad DP of this example is arranged asymmetrically with respect to the central line EC of the emitter electrode 60.

The dummy pad DP is arranged farther on the positive side in the X-axis direction than the central line EC. As a result, the interval between the connection points $P_d$ and $P_{d'}$ at the ends of the dummy wire DW can be made longer, and therefore the wire bonding of the dummy wire DW is easier. For example, the interval between the connection points $P_d$ and $P_{d'}$ may be greater than or equal to five times the diameter of the dummy wire DW, preferably greater than or equal to ten times the diameter of the dummy wire DW. Furthermore, the interval between the connection points $P_d$ and $P_{d'}$ may be greater than or equal to 1 mm, preferably greater than or equal to 2 mm. In other words, in a case where the dummy pad DP is arranged on the lead side, i.e. the positive side in the X-axis direction, the connection point $P_d$ of the dummy wire DW is preferably arranged on the side opposite the lead side, i.e. the negative side in the X-axis direction, relative to the connection points $P_{1a}$, $P_{1b}$, and $P_{1c}$ of the emitter wires EW1 to EW3.

On the other hand, the gate pad GP is arranged symmetrically with respect to the central line EC. However, it should be noted that the gate pad GP may also be arranged asymmetrically with respect to the central line EC, in the same manner as the dummy pad DP.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

10: semiconductor substrate, 12: drift region, 14: buffer region, 16: emitter region, 18: base region, 20: collector region, 30: dummy trench, 32: dummy insulating film, 34:

dummy conduction portion, 36: dummy contact, 40: gate trench, 42: gate insulating film, 44: gate conduction portion, 46: gate contact, 48: opposing end portion, 50: interlayer insulating film, 60: emitter electrode, 62: emitter contact, 64: recessed portion, 70: collector electrode, 80: external terminal, 100: semiconductor device

What is claimed is:

1. A semiconductor device comprising:
 a semiconductor substrate;
 a dummy trench that is formed on a front surface side of the semiconductor substrate;
 an emitter electrode that is formed above a front surface of the semiconductor substrate and includes a recessed portion that is a recess in an outer periphery thereof, as seen in a planar view;
 a dummy pad that is electrically connected to the dummy trench and has at least a portion thereof formed within the recessed portion, as seen in the planar view;
 a dummy wire that electrically connects the emitter electrode and the dummy pad; and
 one or more emitter wires that each have a lead extending outside of the emitter electrode and electrically connect the emitter electrode and an external terminal, wherein
 the one or more emitter wires each have a connection point connecting to the emitter electrode both on the lead side of the one or more emitter wires and on the side that is opposite the lead side in a manner to sandwich the dummy pad, and
 the dummy wire has a connection point connecting to the emitter electrode on a side that is opposite a lead side of the one or more emitter wires in a manner to sandwich the dummy pad.

2. The semiconductor device according to claim 1, wherein
 the one or more emitter wires include a first emitter wire that is adjacent to the dummy wire and a second emitter wire that is adjacent to and arranged in parallel with the first emitter wire, and
 an interval between the connection point of the dummy wire and a connection point of the first emitter wire is greater than an interval between the connection point of the first emitter wire and a connection point of the second emitter wire.

3. The semiconductor device according to claim 1, wherein
 the connection point of the dummy wire is at a distance from an end of the emitter electrode on the side that is opposite the lead side in a manner to sandwich the dummy pad that is less than a distance from each of the connection points of the one or more emitter wires to the side that is opposite the lead side in a manner to sandwich the dummy pad.

4. The semiconductor device according to claim 1, wherein
 the dummy pad is asymmetrical with respect to a central line of the emitter electrode, as seen in the planar view.

5. The semiconductor device according to claim 1, further comprising:
 a gate trench that is formed on the front surface side of the semiconductor substrate; and
 a gate pad that is electrically connected to the gate trench and arranged with linear symmetry relative to a central line of the emitter electrode, as seen in the planar view.

6. The semiconductor device according to claim 5, wherein
 at least a portion of the gate trench is formed in an underlying layer of the dummy pad.

7. The semiconductor device according to claim 6, further comprising:
 an emitter region that is formed adjacent to the dummy trench and the gate trench on the front surface of the semiconductor substrate; and
 a contact portion that electrically connects the dummy pad and the emitter region.

8. The semiconductor device according to claim 5, further comprising:
 a gate runner that is formed outside of the emitter electrode, as seen in the planar view, and electrically connects the gate trench and the gate pad; and
 a dummy runner that is arranged between an outer periphery of the emitter electrode and an inner periphery of the gate runner, as seen in the planar view, and electrically connects the dummy trench and the dummy pad.

9. The semiconductor device according to claim 8, wherein
 the gate pad is formed outside of the dummy runner and the gate runner, as seen in the planar view,
 the gate runner includes a first opposing end portion and a second opposing end portion that is opposite the first opposing end portion, and
 the dummy runner is formed transecting a space between the first opposing end portion and the second opposing end portion, as seen in the planar view.

10. The semiconductor device according to claim 8, wherein the gate runner is shaped as a ring that covers an outer periphery of the emitter electrode, as seen in the planar view.

\* \* \* \* \*